(12) United States Patent
Tan

(10) Patent No.: US 6,842,082 B2
(45) Date of Patent: Jan. 11, 2005

(54) PROGRAMMABLE VOLTAGE-CONTROLLED OSCILLATOR WITH SELF-CALIBRATION FEATURE

(75) Inventor: Mehmet Ali Tan, Irvine, CA (US)

(73) Assignee: Agere Systems Inc., Allentown, PA (US)

( * ) Notice: Subject to any disclaimer, the term of this patent is extended or adjusted under 35 U.S.C. 154(b) by 48 days.

(21) Appl. No.: 10/452,091

(22) Filed: May 30, 2003

(65) Prior Publication Data

US 2004/0239431 A1 Dec. 2, 2004

(51) Int. Cl.[7] .............................. H03B 5/04; H03B 5/24; H03L 1/00
(52) U.S. Cl. ........................................ 331/175; 331/57
(58) Field of Search .............................. 331/44, 57, 65, 331/175

(56) References Cited

U.S. PATENT DOCUMENTS 6,624,710 B2 * 9/2003 Tian ........................... 331/179

OTHER PUBLICATIONS

U.S. patent application Ser. No. 10/452,661, Tan et al., filed May 30, 2003, "Reduced Complexity Linear Phase Detector."

U.S. patent application Ser. No. 10/452,657, DeVeirman et al., filed May 30, 2003, "Phase–Locked Loop with Loop Select Signal Based Switching Between Frequency Detection and Phase Detection."

U.S. patent application Ser. No. 10/452,329, Tan, filed May 30, 2003, "Resistor Value Detection Circuit."

* cited by examiner

Primary Examiner—David Mis

(57) ABSTRACT

A programmable voltage-controlled oscillator includes a ring oscillator having a number of selectable delay stages, and a resistor value detection circuit configurable for coupling to an external resistor. The resistor value detection circuit includes at least one internal resistor and is operative to generate, based at least in part on a value of the external resistor, an output signal indicative of a value of the internal resistor. The output signal is utilizable in controlling an oscillation frequency of the ring oscillator based at least in part on selection of one or more of the selectable delay stages. The voltage-controlled oscillator may be utilized in a phase-locked loop of clock recovery circuit in an integrated circuit, and in numerous other applications.

17 Claims, 4 Drawing Sheets

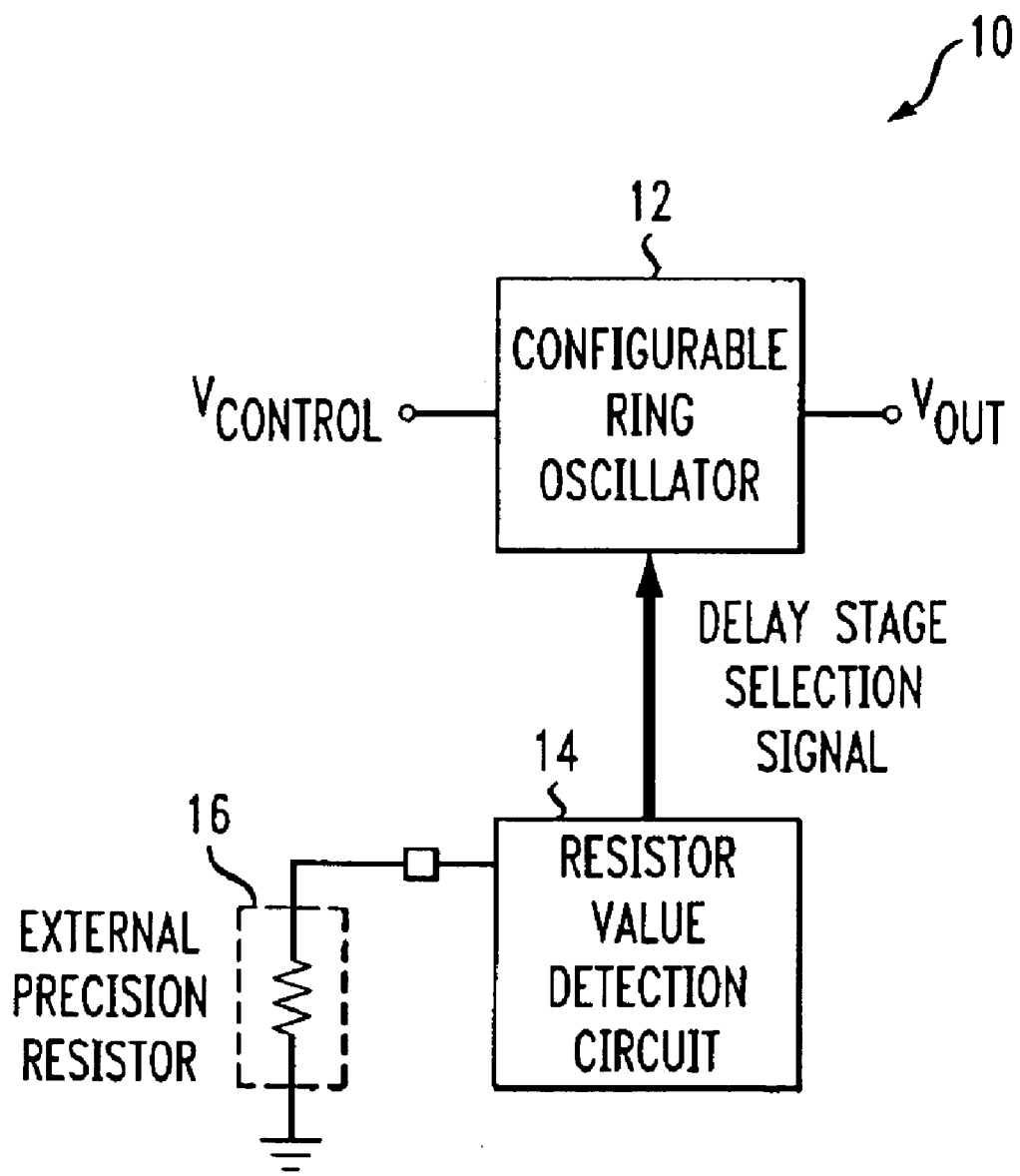

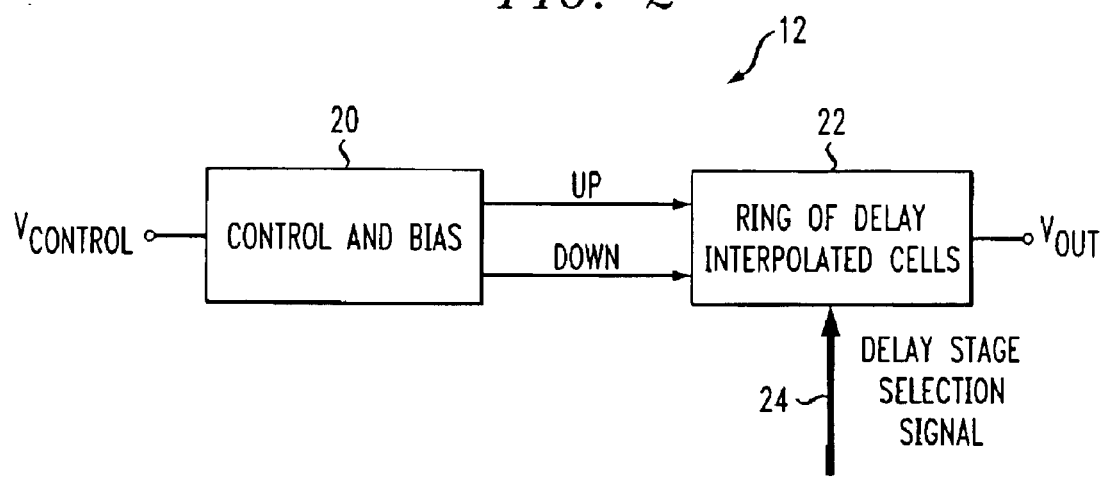
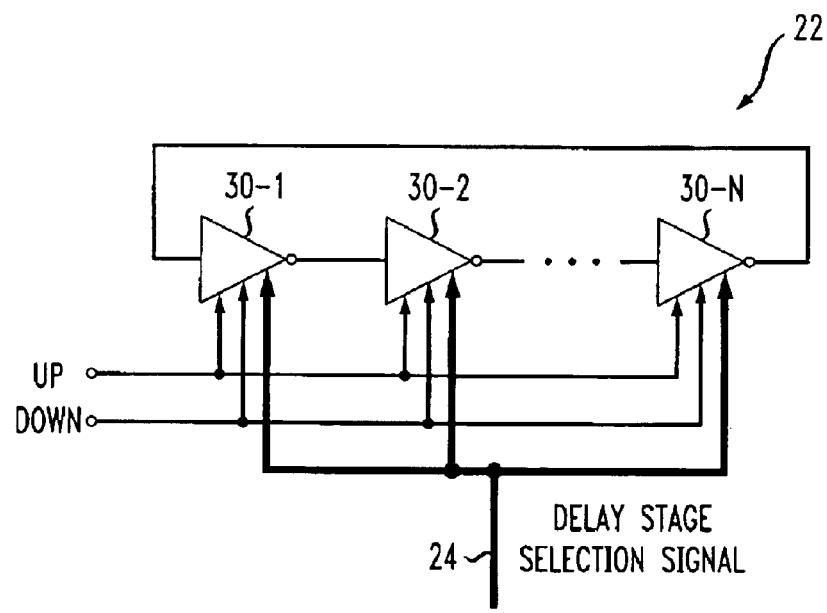

PROGRAMMABLE VOLTAGE-CONTROLLED OSCILLATOR WITH SELF-CALIBRATION FEATURE

FIELD OF THE INVENTION

The present invention relates generally to the field of electronic circuits, and more particularly to voltage-controlled oscillator (VCO) circuits for use in phase-locked loops (PLLs) and other applications.

BACKGROUND OF THE INVENTION

A conventional VCO may include a ring oscillator that is formed of a controllable ring of inverter stages which utilize one or more internal resistors as load devices. Such a VCO may be utilized as an element of a PLL in a clock recovery circuit or other type of circuit. The free-running frequency of the ring oscillator strongly depends on the internal resistor value, at least in part because associated capacitance value does not vary as much as the resistor value.

A problem that arises in a conventional VCO of the type described above is that the internal resistor value is typically subject to an excessively large variation within a given integrated circuit manufacturing process. As a result, for a particular integrated circuit VCO design, integrated circuits from different fabrication lots of the same manufacturing process can have significant differences between the values of their respective internal resistors, and thus their achievable VCO oscillation frequencies. This problem adversely impacts the production yield of the integrated circuit manufacturing process, and increases device cost.

One approach to addressing this issue involves increasing the gain of the VCO, generally denoted $K_{VCO}$, such that a higher oscillation frequency can be achieved for a given internal resistor value. However, this approach can cause a significant amount of additional jitter in the resultant output signal, which is clearly undesirable in many applications.

A need therefore exists in the art for techniques which permit the achievable VCO oscillation frequency to be accurately controlled from one integrated circuit device to another in the presence of process-related variations in internal resistor value, without requiring jitter-inducing increases in the VCO gain.

SUMMARY OF THE INVENTION

The present invention provides an improved VCO which addresses one or more of the above-identified issues.

In accordance with one aspect of the invention, a VCO includes a ring oscillator having a number of selectable delay stages, and a resistor value detection circuit configurable for coupling to an external resistor. The resistor value detection circuit includes at least one internal resistor and is operative to generate, based at least in part on a value of the external resistor, an output signal indicative of a value of the internal resistor.

In an illustrative embodiment, the output signal is utilizable in controlling a free-running oscillation frequency of the ring oscillator based at least in part on selection of one or more of the selectable delay stages.

The selectable delay stages may each comprise a delay cell implemented as a reconfigurable buffer. More specifically, a given one of the delay cells may comprise a plurality of buffers arranged in parallel, with at least a subset of the buffers having a corresponding delay element connected in series therewith. The plurality of buffers are preferably arranged in a plurality of groups of two or more buffers each, with each of the groups being associated with a different process type including at least a slowest process type and a fastest process type.

A VCO having a self-calibration feature in accordance with the invention may be implemented, for example, as a portion of an integrated circuit. As a more particular example, the VCO may be implemented as an element of a PLL in a clock recovery circuit which is itself implemented as a portion of an integrated circuit.

Advantageously, a VCO in accordance with the illustrative embodiment of the invention provides substantially improved consistency in free-running oscillation frequency in the presence of process-related variations in internal resistor value, and without the increased jitter associated with the convention approach described above. This increases the production yield of the integrated circuit manufacturing process, and reduces device cost.

BRIEF DESCRIPTION OF THE DRAWINGS

FIG. 1 shows a portion of an integrated circuit which includes a programmable VCO in accordance with an illustrative embodiment of the invention, and is coupled to an associated external resistor.

FIG. 2 is a schematic diagram of a ring oscillator in the programmable VCO of the integrated circuit of FIG. 1.

FIG. 3 is a schematic diagram of a ring of delay interpolated cells in the ring oscillator of FIG. 2.

DETAILED DESCRIPTION OF THE INVENTION

Figure 4:
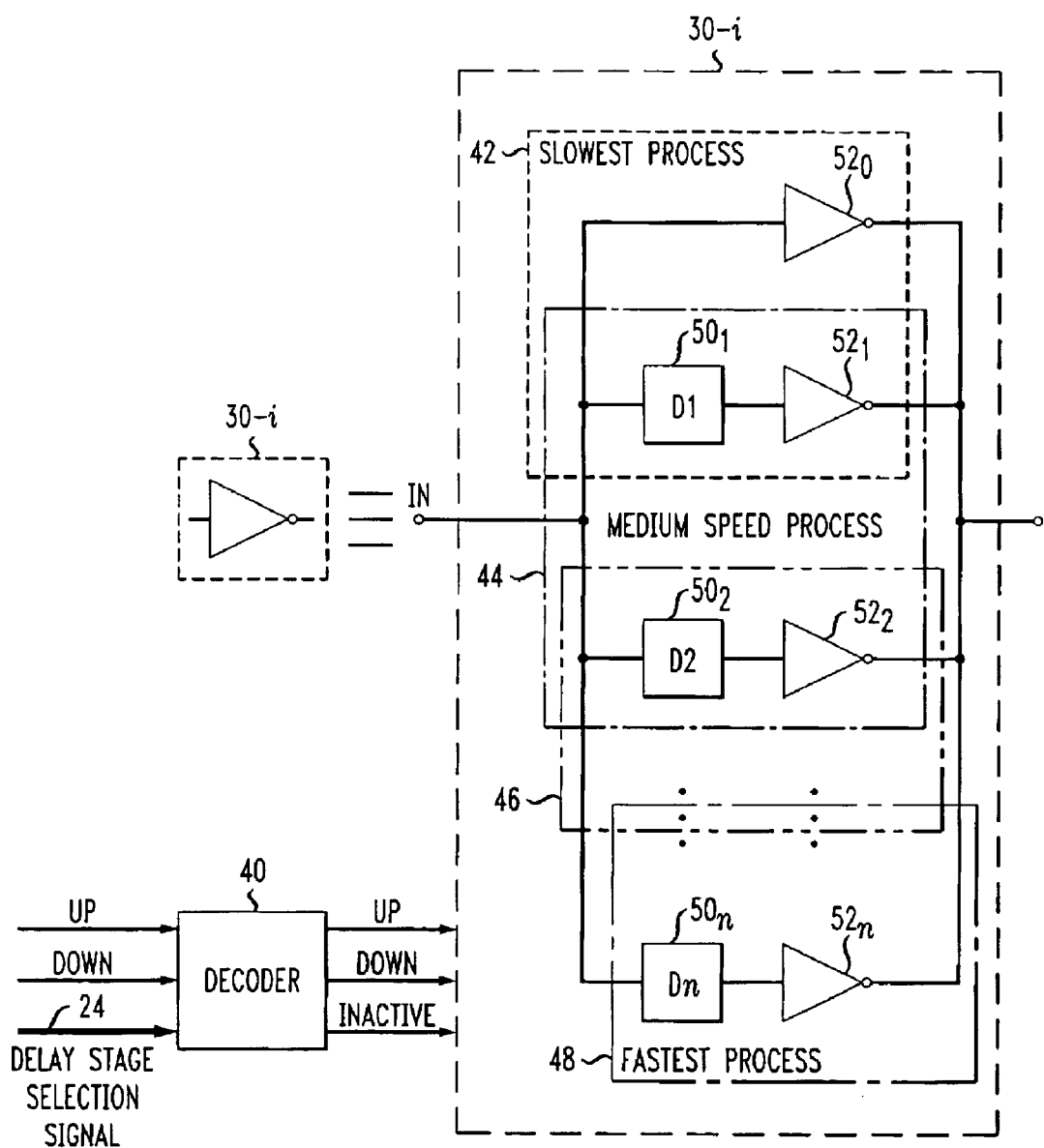
FIG. 4 shows a more detailed view of a particular one of the delay interpolated cells of FIG. 3 and associated control circuitry.

The present invention will be illustrated herein in conjunction with an exemplary embodiment of a programmable VCO and associated integrated circuit implementations thereof. It should be understood, however, that the invention is not limited to use with the particular circuitry arrangements of the illustrative embodiment. For example, although particularly well-suited for use in a PLL in a clock recovery circuit application, a programmable VCO in accordance with the invention can be used in a wide variety of other integrated circuit applications, such as those involving non-programmable VCOs or other similar circuits, as well as in non-integrated circuit applications.

FIG. 1 shows a portion of an integrated circuit 10 which includes a programmable VCO comprising a configurable ring oscillator 12 and a resistor value detection circuit 14. A signal line of the integrated circuit is coupled to an external precision resistor 16. The resistor 16 is "external" in this embodiment in that it is external to the integrated circuit itself. For example, the resistor 16 may comprise an element of a circuit board to which the integrated circuit is mounted. The resistor 16 serves as a value reference for use in determining the value of an "internal" resistor, that is, a resistor internal to the resistor value detection circuit 14 of the integrated circuit 10.

The internal resistor value in this embodiment is an internal resistor which is used as a load resistor for setting the free-running oscillation frequency of the programmable VCO comprising the configurable ring oscillator 12. As will be described below with reference to FIG. 5, the programmable VCO of FIG. 1 may be utilized as a VCO in a PLL of a clock recovery circuit.

The resistor value detection circuit 14 is preferably configured to include comparison circuitry which generates, based at least in part on a value of the external resistor 16, an output indicative of a value of the internal resistor.

As will be appreciated by those skilled in the art, utilization of the resistor value detection circuit 14 in the manner described herein provides the programmable VCO with a self-calibration feature that reduces variation in its free-running oscillation frequency in the presence of process-related variations from device to device as may arise, for example, between devices from different fabrication lots.

The output generated by the comparison circuitry may comprise an encoded digital output signal representative of the value of the internal resistor. This signal is also denoted in FIG. 1 as a delay stage selection signal, and is supplied from the resistor value detection circuit 14 to a delay stage selection input of the configurable ring oscillator 12. The delay stage selection signal may be in the form of a parallel digital signal of a designated n-bit bus width, a serial signal, or in any other desired format.

An example value of n suitable for use in the illustrative embodiment is three, although other higher or lower values can be used.

Additional details regarding the operation of an exemplary resistor value detection circuit suitable for use with the present invention may be found in U.S. patent application Ser. No. 10/452,329 entitled "Resistor Value Detection Circuit," which is filed concurrently herewith and incorporated by reference herein. Other types of resistor value detection circuits or techniques may also be used in implementing the present invention.

The term "resistor" as used herein is intended to include, by way of example and without limitation, a discrete resistor, an integrated resistor, a precision resistor, a resistor implemented utilizing at least one transistor, sets of multiple discrete or integrated transistors, etc. The invention is therefore not limited with regard to the particular types of external and internal resistors that may be used in a given embodiment. The "value" of a given resistor is generally intended to include, again by way of example and without limitation, its resistance value.

FIG. 2 shows the configurable ring oscillator 12 of FIG. 1 in greater detail. The ring oscillator 12 includes a control and bias element 20 coupled to a ring of delay interpolated cells 22. The delay interpolated cells 22 are an example of what are more generally referred to herein as delay stages. The delay stage selection signal from resistor value detection circuit 14 is supplied to a delay stage selection input of the ring of delay interpolated cells 22 via signal line 24 as shown.

A control voltage $V_{CONTROL}$ is applied to an input of the control and bias element 20, and is converted therein in a conventional manner to UP and DOWN signals that are applied to corresponding inputs of the ring of delay interpolated cells. As will be appreciated by those skilled in the art, the UP and DOWN signals are utilized to control the oscillation frequency of the output signal $V_{OUT}$.

FIG. 3 shows a more detailed view of one possible implementation of the ring of delay interpolated cells 22. As is apparent from the figure, the ring of delay interpolated cells comprises a plurality of delay cells 30-1, 30-2, ... 30-N, illustratively shown as inverters, interconnected serially to form a ring. Each of the delay cells in this embodiment is implemented as a reconfigurable buffer, and receives as control inputs the UP and DOWN signals from the control and bias element 20 and the delay stage selection signal supplied from the resistor value detection circuit 14 via signal line 24.

The delay cells 30-1, 30-2, ... 30-N in the ring of delay cells 22 are configured for utilization of a resistor load to set the free-running oscillation frequency of the ring. The oscillation frequency is adjustable responsive to the $V_{CONTROL}$ signal and the UP and DOWN signals generated therefrom, by appropriate control of the amount of delay provided by one or more of the delay cells.

FIG. 4 shows a given one of the delay cells 30-i, where i may be 1, 2, ... or N, in the ring of delay interpolated cells 22. As noted above, the given delay cell 30-i is implemented in this embodiment as a reconfigurable buffer.

Also shown in the figure is associated control circuitry comprising a decoder 40 which receives as inputs the UP, DOWN and delay stage selection signals, and has outputs corresponding to the UP and DOWN signals and an INACTIVE signal. A single common decoder 40 in the illustrative embodiment is associated with each of the delay cells 30-1, 30-2, ... 30-N. Other decoder circuitry arrangements may be used.

The delay cell 30-i includes multiple groups of buffers, with each group of buffers being associated with a particular process type. More specifically, in this particular example, groups 42, 44, 46 and 48 are shown. Each group preferably includes a pair of buffers arranged in parallel, although other groupings and arrangements can be used, with each of the buffers in the pair providing a different delay path.

In operation, a particular one of the groups is selected, and a desired amount of delay can be interpolated between the two different delay paths associated therewith by controlling the manner in which current is steered to the paths using the UP and DOWN signals.

The first group 42 is associated with the slowest process, that is, the process which results in the slowest signal propagation through the corresponding buffers. The second and third groups 44 and 46 may be viewed as being associated with medium speed process types. The fourth group 48 is associated with the fastest process, that is, the process which results in the fastest signal propagation through the corresponding buffers.

The buffers of the groups 42, 44, 46 and 48 collectively comprise a parallel interconnection of a total of n+1 buffers, with each of the buffers other than the first buffer in group 42 having a delay element associated therewith. The delay elements $50_1, 50_2, \ldots 50_n$ provide amounts of delay denoted D1, D2, ... Dn, respectively, and their associated buffers are denoted $52_1, 52_2, \ldots 52_n$, respectively. The first buffer in group 42 is denoted $52_0$ in the figure. As indicated previously, an example value of n suitable for use in the illustrative embodiment is three, although other higher or lower values can be used.

In the delay cells 30-i, the delay required for a slow process type is less than the delay required for a fast process type. The amounts of delay D1, D2, ... Dn provided by the delay elements $50_1, 50_2, \ldots 50_n$ are therefore configured accordingly. Suitable values for the amounts of delay are dependent upon implementation-specific factors such as the particular process variations that are present, and can be readily determined in a straightforward manner.

The delay stage selection signal is utilized in decoder 40 to determine which of the delay cells 30-1, 30-2, ... 30-N in the ring 22 will be fed by the UP and DOWN signals and which of the delay cells 30-1, 30-2, . . . 30-N will be deactivated, in order to provide the desired adjustment in the free-running oscillation frequency. For a given one of the delay cells which will remain active, the UP and DOWN signals are supplied thereto by the decoder 40, and the INACTIVE signal applied thereto is deasserted. For a given one of the delay cells which will be deactivated, the INACTIVE signal applied thereto is asserted.

Each of the delay cells 30-1, 30-2, . . . 30-N in the ring 22 is preferably implemented in substantially the same manner, such as the manner illustrated in FIG. 4, although this is not a requirement of the invention. A given ring of cells in an alternative embodiment may therefore be configured such that only a subset of the cells are utilizable for delay interpolation.

Advantageously, the programmable VCO of the illustrative embodiment includes a self-calibration feature which substantially reduces process-related variation in the free-running oscillation frequency of the VCO from device to device. This increases the production yield of the integrated circuit manufacturing process, and reduces device cost.

Moreover, this advantage is provided without requiring jitter-inducing increases in the VCO gain. For example, the VCO gain $K_{VCO}$ in the illustrative embodiment may be less than approximately one-half of the free-running frequency per volt controlled.

A programmable VCO of the type described above can be utilized in a wide variety of integrated circuit applications.

Figure 5:
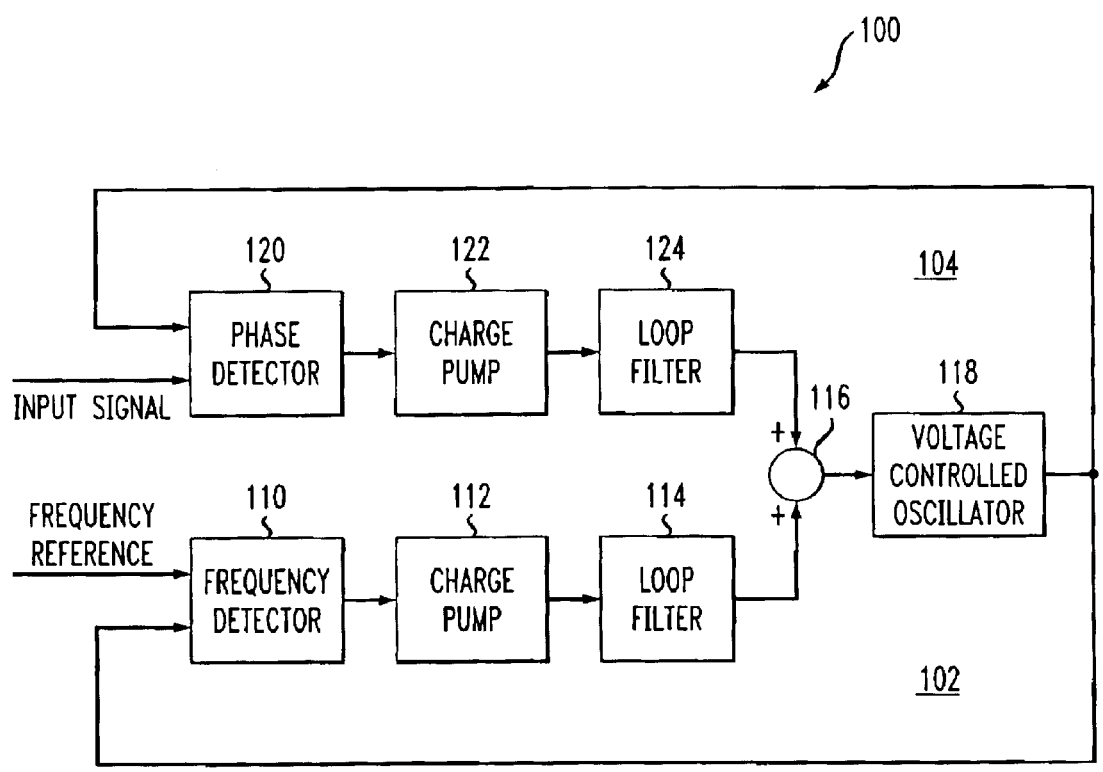
FIG. 5 shows an example of a dual-loop PLL in which a programmable VCO of the present invention may be implemented.

An example of one such integrated circuit application will now be described in greater detail with reference to FIG. 5, which shows a dual-loop PLL 100 in which the present invention may be implemented.

The dual-loop PLL 100 is of a type described in greater detail in U.S. Patent Application Ser. No. 10/452,657, entitled "Phase-locked Loop with Loop Select Signal Based Switching Between Frequency Detection and Phase Detection," which is filed concurrently herewith and incorporated by reference herein. It should be noted that, although not shown as such in FIG. 5, the dual-loop PLL 100 may include a loop select signal based switching feature configured as described in the Chen 1-1-2 U.S. Patent Application.

The dual-loop PLL 100 includes a first loop 102 corresponding to a frequency loop and a second loop 104 corresponding to a phase loop.

The frequency loop 102 includes a frequency detector 110, a charge pump 112, a loop filter 114, a signal combiner 116 and a VCO 118. The frequency detector 110 receives as its inputs a frequency reference signal and an output of the VCO 118.

The VCO 118 may comprise the configurable ring oscillator 12 and may be coupled to the resistor value detection circuit 14 as indicated in FIG. 1. More specifically, an internal resistor with its value determined by the resistor value detection circuit 14 may be utilized as a load resistor in conjunction with an otherwise conventional technique for setting the free-running oscillation frequency of the configurable ring oscillator 12.

The phase loop 104 includes a phase detector 120, a charge pump 122, a loop filter 124, the signal combiner 116 and the VCO 118. The phase detector 120 receives as its inputs an input signal and an output of the VCO 118. For example, in a clock recovery application, the input signal may comprise a data signal to which a clock signal is to be phase locked.

The phase detector 120 is preferably a linear phase detector of the type described in U.S. Patent Application Ser. No. 10/452,657, entitled "Reduced Complexity Linear Phase Detector," which is filed concurrently herewith and incorporated by reference herein.

As is apparent from the figure, the frequency loop 102 and phase loop 104 are coupled together so as to share a number of loop components, including in this example a series combination of the signal combiner 116 and the VCO 118.

Generally, the frequency loop 102 provides frequency acquisition of the frequency reference signal, and the phase loop 104 provides phase locking of the input signal to the acquired frequency reference signal. Conventional aspects of the operation of these loops and their associated components are well-known in the art, and therefore not further described herein.

It should again be emphasized that the exemplary circuitry arrangements described in conjunction with FIGS. 1 through 5 are intended to illustrate the operation of the invention, and therefore should not be construed as limiting the invention to any particular embodiment or group of embodiments. Furthermore, it will be apparent to those skilled in the art that the particular circuitry shown herein for purposes of illustrating the invention may be implemented in many different ways, and may include additional or alternative elements.

These and numerous other alternative embodiments within the scope of the following claims will therefore be apparent to those skilled in the art.

What is claimed is:

1. A circuit comprising:
   a ring oscillator having a plurality of selectable delay stages; and
   a resistor value detection circuit configurable for coupling to an external resistor, the resistor value detection circuit comprising at least one internal resistor and being operative to generate, based at least in part on a value of the external resistor, an output signal indicative of a value of the internal resistor;
   wherein the output signal is utilizable in controlling an oscillation frequency of the ring oscillator based at least in part on selection of one or more of the selectable delay stages.

2. The circuit of claim 1 wherein the output signal generated by the resistor value detection circuit comprises an encoded digital output signal representative of the value of the internal resistor.

3. The circuit of claim 1 wherein the oscillation frequency of the configurable ring oscillator comprises a free-running oscillation frequency of the ring oscillator.

4. The circuit of claim 1 wherein the ring oscillator further comprises a control and bias element having an input adapted to receive a control voltage and outputs corresponding to respective up and down control signals generated based at least in part on the control voltage, the up and down control signals controlling an oscillation frequency of the ring oscillator responsive to the control voltage.

5. The circuit of claim 4 wherein one or more of the selectable delay stages each comprises up and down control inputs adapted to receive the respective up and down control signals.

6. The circuit of claim 1 wherein the ring oscillator further comprises a decoder responsive to the output signal and operative to control activation of one or more of the selectable delay stages.

7. The circuit of claim 1 wherein one or more of the selectable delay stages each comprises a delay cell.

8. The circuit of claim 7 wherein the delay cell is implemented as a reconfigurable buffer.

9. The circuit of claim 7 wherein the delay cell comprises a plurality of buffers arranged in parallel, with at least a subset of the buffers having a corresponding delay element connected in series therewith.

10. The circuit of claim 9 wherein the plurality of buffers comprise a plurality of groups of two or more buffers each, with each of the groups being associated with a different process type including at least a slowest process type and a fastest process type.

11. The circuit of claim 1 wherein the output signal generated by the resistor value detection circuit controls activation of one or more of the selectable delay stages.

12. The circuit of claim 1 wherein the ring oscillator and the resistor value detection circuit are implemented as components of an integrated circuit.

13. The circuit of claim 1 wherein the circuit comprises a programmable voltage-controlled oscillator circuit.

14. The circuit of claim 13 wherein said voltage-controlled oscillator circuit comprises an element of a phase-locked loop in a clock recovery circuit.

15. An integrated circuit comprising a voltage-controlled oscillator and at least one additional circuit associated with the voltage-controlled oscillator, the voltage-controlled oscillator comprising:

a ring oscillator having a plurality of selectable delay stages; and a resistor value detection circuit configurable for coupling to an external resistor, the resistor value detection circuit comprising at least one internal resistor and being operative to generate, based at least in part on a value of the external resistor, an output signal indicative of a value of the internal resistor;

wherein the output signal is utilizable in controlling an oscillation frequency of the ring oscillator based at least in part on selection of one or more of the selectable delay stages.

16. The integrated circuit of claim 15 wherein said additional circuit comprises a phase-locked loop which includes the voltage-controlled oscillator.

17. A method for use in a circuit comprising (i) a ring oscillator having a plurality of selectable delay stages, and (ii) a resistor value detection circuit which includes an internal resistor and is configurable for coupling to an external resistor, the method comprising the steps of:

generating in the resistor value detection circuit, based at least in part on a value of the external resistor, an output signal indicative of a value of the internal resistor; and utilizing the output signal in controlling an oscillation frequency of the ring oscillator based at least in part on selection of one or more of the selectable delay stages.

* * * * *